(12) United States Patent
Itoyama et al.

(10) Patent No.: US 10,065,286 B2
(45) Date of Patent: *Sep. 4, 2018

(54) POLISHING PAD AND MANUFACTURING METHOD THEREFOR

(75) Inventors: Kouki Itoyama, Odawara (JP); Fumio Miyazawa, Gotemba (JP)

(73) Assignee: FUJIBO HOLDINGS, INC., Chuo-Ku, Tokyo (JP)

( * ) Notice: Subject to any disclaimer, the term of this patent is extended or adjusted under 35 U.S.C. 154(b) by 156 days.

This patent is subject to a terminal disclaimer.

(21) Appl. No.: 14/111,888

(22) PCT Filed: Apr. 16, 2012

(86) PCT No.: PCT/JP2012/060275
§ 371 (c)(1),
(2), (4) Date: Oct. 15, 2013

(87) PCT Pub. No.: WO2012/141329
PCT Pub. Date: Oct. 18, 2012

(65) Prior Publication Data
US 2014/0038503 A1 Feb. 6, 2014

(30) Foreign Application Priority Data
Apr. 15, 2011 (JP) .................... 2011-091285

(51) Int. Cl.
*B24B 37/24* (2012.01)
*B24B 37/22* (2012.01)
(Continued)

(52) U.S. Cl.
CPC .............. *B24B 37/24* (2013.01); *B24B 37/22* (2013.01); *C08G 18/10* (2013.01);
(Continued)

(58) Field of Classification Search
CPC ....... B24B 37/22; B24B 37/24; B24D 11/001; B24D 11/003; C08G 18/10; C08G 18/4854; C08G 18/7621; C08J 9/12; H01L 21/304
(Continued)

(56) References Cited

U.S. PATENT DOCUMENTS

2003/0109209 A1   6/2003  Hishiki
2004/0096529 A1*  5/2004  Shih ................. B24B 37/26
                                                        425/1
(Continued)

FOREIGN PATENT DOCUMENTS

CN     1407606 A    4/2003
JP     10-6211 A    1/1998
(Continued)

OTHER PUBLICATIONS

Office Action and Search Report issued by the Chinese Patent Office in corresponding Chinese Patent Application No. 2012800254143 dated Aug. 26, 2015 (5 pages).
(Continued)

*Primary Examiner* — Monica Carter
*Assistant Examiner* — Marcel Dion
(74) *Attorney, Agent, or Firm* — Buchanan, Ingersoll & Rooney PC

(57) ABSTRACT

A polishing pad for polishing a semiconductor device and manufacturing method therefor, the polishing pad comprising a polishing layer having a polyurethane-polyurea resin foam containing substantially spherical cells, wherein an M-component of the polyurethane-polyurea resin foam has a spin-spin relaxation time T2 of 160 to 260 μs, the polyurethane-polyurea resin foam has a storage elastic modulus E' of 1 to 30 MPa, the storage elastic modulus E' being measured at 40° C. with an initial load of 10 g, a strain range (Continued)

of 0.01 to 4%, and a measuring frequency of 0.2 Hz in a tensile mode, and the polyurethane-polyurea resin foam has a density D in a range from 0.30 to 0.60 g/cm$^3$. The polishing pad remedies the problem of scratches occurring when a conventional hard (dry) polishing pad is used, which is excellent in polishing rate and polishing uniformity, and can be used for primary polishing or finish polishing.

9 Claims, 1 Drawing Sheet

(51) Int. Cl.
*H01L 21/304* (2006.01)
*C08J 9/12* (2006.01)
*C08G 18/48* (2006.01)
*C08G 18/76* (2006.01)
*C08G 18/10* (2006.01)
*C08G 101/00* (2006.01)

(52) U.S. Cl.
CPC ..... *C08G 18/4854* (2013.01); *C08G 18/7621* (2013.01); *C08J 9/12* (2013.01); *H01L 21/304* (2013.01); *C08G 2101/0008* (2013.01); *C08J 2207/00* (2013.01); *C08J 2375/04* (2013.01)

(58) Field of Classification Search
USPC ......................................... 451/526, 533, 550
See application file for complete search history.

(56) References Cited

U.S. PATENT DOCUMENTS

| | | | |
|---|---|---|---|
| 2005/0064709 A1* | 3/2005 | Shimomura | B24B 37/24 438/689 |
| 2005/0150598 A1 | 7/2005 | Moeggenborg et al. | |
| 2006/0060569 A1* | 3/2006 | Tano | B24B 37/24 216/88 |
| 2006/0286906 A1* | 12/2006 | Myers | B24B 37/24 451/41 |
| 2007/0141312 A1* | 6/2007 | James | B24B 37/22 428/212 |
| 2007/0275226 A1 | 11/2007 | Kulp | |
| 2009/0017729 A1* | 1/2009 | Halberg | B24B 37/24 451/36 |
| 2010/0087128 A1* | 4/2010 | Nakayama | B24B 37/24 451/548 |
| 2011/0076928 A1 | 3/2011 | James et al. | |

FOREIGN PATENT DOCUMENTS

| | | | |
|---|---|---|---|
| JP | 2006-114885 A | | 4/2006 |
| JP | 2006-142474 A | | 6/2006 |
| JP | 3788729 B2 | | 6/2006 |
| JP | 3924952 B2 | | 6/2007 |
| JP | 2007-519783 A | | 7/2007 |
| JP | 2007-238783 A | | 9/2007 |
| JP | 3983610 B2 | | 9/2007 |
| JP | 2007-313641 A | | 12/2007 |
| JP | 2009-214275 A | | 9/2009 |
| JP | 2009-241224 A | | 10/2009 |
| JP | 4338150 B2 | | 10/2009 |
| JP | 2009-256473 A | | 11/2009 |
| JP | 2010-58194 A | | 3/2010 |
| JP | 2010058194 A | * | 3/2010 |
| JP | 2010-076076 A | | 4/2010 |
| JP | 2010-82708 A | | 4/2010 |
| JP | 2010-82719 A | | 4/2010 |
| JP | 2010-82721 A | | 4/2010 |
| JP | 2010082719 A | * | 4/2010 |
| JP | 2010-240777 A | | 10/2010 |
| JP | 2011-067945 A | | 4/2011 |

OTHER PUBLICATIONS

Office Action dated Oct. 27, 2014, by the Japanese Patent Office in corresponding Japanese Patent Application No. 2011-091285. (3 pages).
Extended Search Report issued in corresponding European Application No. 12770798 dated Jan. 30, 2015 (6 pages).
Amemiya, "Characterization of Polyurethane Resin Using Pulse NMR and High Resolution Solid-State NMR", DIC Technical Review, (2006), No. 12, pp. 7-12.
Flory Paul J., "Molecular Size Distribution in Linear Condensation Polymers", Journal of American Chemical Society (1936), vol. 58, pp. 1877-1885.
International Search Report (PCT/ISA/210) dated May 22, 2012, by the Japanese Patent Office as the International Searching Authority for International Application No. PCT/JP2012/060273.
Written Opinion (PCT/ISA/237) dated May 22, 2012, by the Japanese Patent Office as the International Searching Authority for International Application No. PCT/JP2012/060273.
International Search Report (PCT/ISA/210) dated May 22, 2012, by the Japanese Patent Office as the International Searching Authority for International Application No. PCT/JP2012/060274.
Written Opinion (PCT/ISA/237) dated May 22, 2012, by the Japanese Patent Office as the International Searching Authority for International Application No. PCT/JP2012/060274.
International Search Report (PCT/ISA/210) dated May 22, 2012, by the Japanese Patent Office as the International Searching Authority for International Application No. PCT/JP2012/060275.
Written Opinion (PCT/ISA/237) dated May 22, 2012, by the Japanese Patent Office as the International Searching Authority for International Application No. PCT/JP2012/060275.

* cited by examiner

POLISHING PAD AND MANUFACTURING METHOD THEREFOR

TECHNICAL FIELD

The present invention relates to a polishing pad, and more specifically to a CMP polishing pad for a semiconductor device.

BACKGROUND ART

Since surfaces of materials such as silicon, hard disks, mother glass for liquid crystal displays, and semiconductor devices need to be flat, the surfaces are polished by the loose abrasive method using a polishing pad. The loose abrasive method is a method in which the work surface of a workpiece is polished while a slurry (polishing liquid) containing abrasive grains is supplied between a polishing pad and the workpiece.

In a polishing pad for a semiconductor device, the surface of the polishing pad is required to have openings for retaining abrasive grains, rigidity for keeping the flatness of the surface of the semiconductor device, and elasticity for preventing scratches on the surface of the semiconductor device. As a polishing pad meeting these requirements, a polishing pad having a polishing layer manufactured from a urethane resin foam has been used.

In general, a urethane resin foam is molded by curing a prepolymer containing an isocyanate group-containing compound based on a reaction with a curing agent (dry method). Then, a polishing pad is formed by slicing this foam into a sheet shape. In a polishing pad (hereinafter, abbreviated as hard (dry) polishing pad in some cases) having a hard polishing layer molded by the dry method as described above, relatively small and substantially spherical cells are formed inside the foam during the curing and molding of the urethane resin. Hence, openings (pores) capable of retaining a slurry during polishing are formed on the polishing surface of the polishing pad formed by the slicing.

Urethane resin foams having cell (air-bubble) diameters of 100 μm or less and around 30 μm have been mainly used as materials of polishing pads for a semiconductor device so far (Patent Literature 1). In addition, the mainly used urethane resin foams have type A hardnesses of 70 degrees or higher, and type D hardnesses of 45 or higher (Patent Literatures 2 and 3). The mainly used urethane resin foams have densities of 0.5 g/cm$^3$ or higher (Patent Literature 1) and, regarding the elasticity, have storage elastic moduli of several hundred megapascals or higher (Patent Literature 4). A mainly employed longitudinal elastic modulus (Young's modulus) is 500 MPa or higher (Patent Literature 5).

Apart from the above-described mainly used urethane resin foams, physical properties of urethane resin foams have been improved from the viewpoints of the bulk density, the type A hardness, and the hard segment content (HSC) (%) in order to reduce wearing to an appropriate degree and stabilize the Polishing performance (Patent Literature 6). Moreover, polishing pads are also reported whose storage elastic moduli are adjusted to be within predetermined ranges in order to reduce the occurrence of scratches (Patent Literatures 7 and 8).

In addition, a polishing pad has been reported whose type A hardness and compression elastic modulus are improved by making the phase separation structure clear (Patent Literature 9). The clear phase separation structure is obtained by determining the component amounts of a crystalline phase (L), an interface phase (M), and an amorphous phase (S) and the spin-spin relaxation times (T2) thereof from a free induction decay signal (FID) of pulsed NMR, and optimizing the T2 and the component amount of the M component. Moreover, a polishing pad has been reported whose dressing properties are improved, while its high hardness is retained (Patent Literature 10). This polishing pad is obtained by adjusting the ratio of the hard segments present in a foamed polyurethane determined by pulsed NMR measurement to 55 to 70%, and thus achieving characteristics such as hardness, low tensile break strength, and low elongation.

CITATION LIST

Patent Literatures

Patent Literature 1: Japanese Patent No. 4338150
Patent Literature 2: Japanese Patent No. 3924952
Patent Literature 3: Japanese Patent No. 3788729
Patent Literature 4: Japanese Patent No. 3983610
Patent Literature 5: Japanese Patent Application Publication No. Hei 10-6211
Patent Literature 6: Japanese Patent Application Publication No. 2010-58194
Patent Literature 7: Japanese Patent Application Publication No. 2006-114885
Patent Literature 8: Japanese Patent Application Publication No. 2009-256473
Patent Literature 9: Japanese Patent Application Publication No. 2010-82719
Patent Literature 10: Japanese Patent Application Publication No. 2010-240777

SUMMARY OF INVENTION

Object to be Solved

However, the above-described dry polishing pads are still hard, and tend to apply a pressure to a workpiece in a localized manner. Hence, the dry polishing pads are unsatisfactory in terms of reduction of polishing scars (scratches) formed on the surface of a workpiece. In addition, the dry polishing pads still have a problem of high possibility of clogging. For this reason, in general, after polishing with a hard polishing pad molded by the dry method, it is necessary to further perform finish polishing by using a polishing pad having a soft polishing layer molded by a wet method (in the wet method, a resin solution obtained by dissolving a resin in a water-miscible organic solvent is applied onto a sheet-shaped film formation substrate, and then the resin is coagulated and regenerated in an aqueous coagulating liquid).

On the other hand, a polishing pad having a soft polishing layer molded by a wet method has a low hardness, has large openings of a suede type, and has a non-uniform foam structure. For these reasons, although polishing using the polishing pad having a soft polishing layer achieves better polishing rate and polishing uniformity (uniformity: followability of the pad surface to waves and warp of a workpiece) than polishing using a polishing pad having a hard polishing layer molded by a dry method, the polishing pad having a soft polishing layer has the following problem. Specifically, because of its anisotropic cell shape, the state of the openings on the surface changes due to wearing, or a low-density portion of the polishing layer at a lower portion thereof is torn off. Hence, the polishing pad having a soft polishing layer cannot retain a polishing state at a certain level for a long period.

Hence, there is a need for a polishing pad which can be used also for finish polishing, while taking advantages of a polishing pad having a polishing layer molded by a dry method.

The present invention has been made in view of the above-described problems, and an object of the present invention is to provide a polishing pad which remedies the problem of scratches occurring when a conventional hard (dry) polishing pad is used, which is excellent in polishing rate and polishing uniformity, and which can be used for not only primary polishing but also finish polishing, and a manufacturing method therefor.

Means for Solving the Object

To achieve the above object, the present invention employs the following configurations.
1. A polishing pad for polishing a semiconductor device, comprising a polishing layer having a polyurethane-polyurea resin foam containing substantially spherical cells, wherein
when a free induction decay signal (FID) of the polyurethane-polyurea resin foam obtained by pulsed NMR is subjected to waveform separation by sequentially subtracting components in descending order of spin-spin relaxation time T2 based on a least-squares method, and thus divided into three components of L (amorphous phase), M (interface phase), and S (crystalline phase) in descending order of spin-spin relaxation time T2, the M-component has a spin-spin relaxation time T2 (hereinafter, referred to as $T2_M$ in some cases) of 160 to 260 μs,
the polyurethane-polyurea resin foam has a storage elastic modulus E' of 1 to 30 MPa, the storage elastic modulus E' being measured at 40° C. with an initial load of 10 g, a strain range of 0.01 to 4%, and a measuring frequency of 0.2 Hz in a tensile mode, and
the polyurethane-polyurea resin foam has a density D in a range from 0.30 to 0.60 g/cm$^3$.
2. The polishing pad according to 1, wherein
the ratio (hereinafter, referred to as $C_M$ in some cases) of the M component present in the resin foam is in a range from 55 to 80% (% by mass), and
an X value determined by $X=T2_M/D$ is in a range from 350 to 800.
3. The polishing pad according to 1 or 2, wherein
the polyurethane-polyurea resin foam has an average cell diameter of 120 to 185 μm.
4. The polishing pad according to any one of 1 to 3, wherein
the polyurethane-polyurea resin foam has a type A hardness of 20 to 55 degrees.
5. The polishing pad according to any one of 1 to 4, wherein
the polyurethane-polyurea resin foam has a type D hardness of 5 to 35 degrees.
6. The polishing pad according to any one of 1 to 5, wherein
a layer harder than the polishing layer is laminated on a surface of the polishing layer, the surface being opposite from a polishing surface of the polishing layer.
7. A method for manufacturing the polishing pad according to any one of 1 to 6, the method comprising:
a preparation step of preparing an isocyanate group-containing compound (A), a polyisocyanate compound (B), a polyamine compound (D), a mixture liquid (E) comprising water, a foam stabilizer, and a reaction catalyst, and a gas non-reactive with all the components;
a mixing step of mixing at least the isocyanate group-containing compound (A), the polyisocyanate compound (B), the polyamine compound (D), the mixture liquid (E) comprising the water, the foam stabilizer, and the reaction catalyst, and the gas non-reactive with all the components with each other to obtain a mixture liquid for molding a foam;
a foam-molding step of molding a polyurethane-polyurea resin foam from the mixture liquid for molding a foam; and
a polishing layer formation step of forming a polishing layer having a polishing surface for polishing a workpiece from the polyurethane-polyurea resin foam.
8. The method for manufacturing the polishing pad according to 7, wherein
in the preparation step, a polyol compound (C-2) is further prepared, and
in the mixing step, the polyol compound (C-2) is mixed.
9. The method for manufacturing the polishing pad according to 8, wherein
in the preparation step, the polyamine compound (D) and the polyol compound (C-2) are prepared, with the equivalence ratio of amino groups of the polyamine compound (D) to the sum of the chemical equivalents of the amino groups of the polyamine compound (D) and hydroxyl groups of the polyol compound (C-2) (the chemical equivalent of active hydrogen groups) being 0.70 to 0.97 (the amino groups/(the amino groups+the hydroxyl groups)).
10. The method for manufacturing the polishing pad according to any one of 7 to 9, wherein
the polyamine compound (D) is a crude methylenebis(o-chloroaniline) (MOCA) which is a mixture of monomer and multimers of MOCA and which contains the multimers in an amount of 15% by mass or more.
11. The method for manufacturing the polishing pad according to 8 or 9, wherein
the polyol compound (C-2) is poly(tetramethylene glycol) or poly(propylene glycol) having a number average molecular weight of 500 to 5000, or a mixture thereof.

Advantageous Effects of Invention

Since the polishing pad of the present invention has a T2 of the M component of pulsed NMR within the moderate range and has moderate dressing properties, scratches due to clogging of opening portions are less likely to be caused. In addition, because of the low storage elastic modulus, the strong pressing is suppressed, and scratches are less likely to be caused. Because of the density in the low range, the polishing pad of the present invention is softer than conventional polishing pads for a semiconductor device. Because of the high porosity (low density), scars due to clogging are also less likely to be formed. Moreover, since the polishing pad of the present invention is softer than polishing pads having polishing layers molded by conventional dry methods, the polishing pad is excellent also in polishing rate and polishing uniformity. Meanwhile, since the polishing pad of the present invention is dry-molded, the polishing pad undergoes less change in cell diameters in the depth direction than the wet-molded polishing pads. Hence, the polishing pad of the present invention can retain a constant polishing state for a long period. Therefore, although dry-molded, the polishing pad of the present invention can be advantageously used for both primary processing and finish processing.

DESCRIPTION OF EMBODIMENTS

Hereinafter, embodiments for carrying out the present invention are described.
<<Polishing Pad>>

The polyurethane-polyurea resin foam is characterized in that when a free induction decay signal (FID) of the polyurethane-polyurea resin foam obtained by pulsed NMR is subjected to waveform separation by sequentially subtracting components in descending order of spin-spin relaxation time T2 based on a least-squares method, and thus divided into three components of L (amorphous phase), M (interface phase), and S (crystalline phase) in descending order of the spin-spin relaxation time T2 (when it is difficult to separate the M component and the L component from each other, the total of the M component and the L component is regarded as the M component), the M component has a spin-spin relaxation time T2 (hereinafter, sometimes referred to as $T2_M$ in some cases) of 160 to 260 µs, the polyurethane-polyurea resin foam has a storage elastic modulus E' of 1 to 30 MPa, the storage elastic modulus E' being measured at 40° C. with an initial load of 10 g, a strain range of 0.01 to 4%, and a measuring frequency of 0.2 Hz in a tensile mode, and the polyurethane-polyurea resin foam has a density D in a range from 0.30 to 0.60 g/cm³.

The polyurethane-polyurea resin foam means a resin foam having at least two urethane bonds or more and at least two urea bonds or more in its molecule. The polyurethane-polyurea resin foam of the present invention can be manufactured from an isocyanate group-containing compound formed by reacting a polyisocyanate compound with a polyol compound, a polyisocyanate compound, a polyamine compound, and a mixture liquid comprising water, a foam stabilizer, and a reaction catalyst (hereinafter, abbreviated as an aqueous dispersion in some cases).

Figure 1:
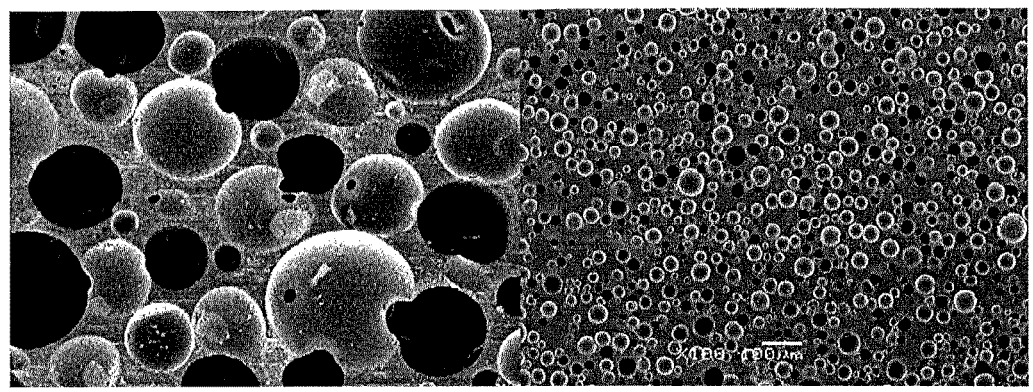
FIG. 1 shows a cross-sectional view (left) of a polishing pad showing an embodiment of the present invention and a cross-sectional view (right) of a polishing pad (Comparative Example 1) having a polishing layer dry-molded by a conventional technique.

In addition, the substantially spherical is a concept meaning an ordinary shape of cells (a shape which is isotropic, and is spherical, elliptical, or close to any of these shapes) present in a foam molded by a dry method (see FIG. 1). These cells are clearly distinguished from cells contained in a foam molded by a wet method (which are anisotropic, and have a structure in which the diameter increases from a polishing layer surface of a polishing pad to a bottom portion thereof).
(Pulsed NMR)

The pulsed NMR measurement is conducted by using a pulsed NMR measurement apparatus (JNM-MU25 manufactured by JEOL Ltd., 25 MHz) by the solid echo method with 90° pulse of 2.0 µs, repetition time: 4 s, number of scans: 8, and temperature: 40° C.

Since the solid echo method has already been well known, details thereof are omitted. The solid echo method is mainly used for measuring samples having short relaxation times, such as glassy or crystalline polymers. In this method, apparent removal of dead time is conducted. This method is a 90° x–τ–90° y pulse method in which two 90° pulses are applied with a phase change of 90°. When a 90° pulse is applied in the X-axis direction, a free induction decay (FID) signal is observed after dead time. When a second 90° pulse is applied in the y-axis direction at a time τ where the FID signal has not decayed, the directions of magnetization are made the same at a time of t=2τ, and an echo appears. The obtained echo can be approximated as an FID signal after a 90° pulse.

A method has been already well known in which the relationship between physical properties, the phase separation structure, and the composition is analyzed based on the analysis results of pulsed NMR. When the free induction decay (FID) signal obtained by pulsed NMR is subjected to waveform separation by sequentially subtracting components in descending order of spin-spin relaxation time T2 based on a least-squares method, the free induction decay (FID) signal can be divided into three components. A component having a long relaxation time is a component having a high mobility, which is defined as an amorphous phase; a component having a short relaxation time is a component having a low mobility, which is defined as a crystal phase; and a component having an intermediate relaxation time is defined as an interface phase (if it is difficult to separate the interface phase component and the amorphous phase component from each other, these components are analyzed as an interface phase component). By using a calculation formula based on a Gaussian function and a Lorentzian function, the component amount of each component can be determined (see, for example, "Characterization of Polyurethane Resin using Pulse NMR and High Resolution Solid-State NMR" (DIC Technical Review, N. 12, pp. 7 to 12, 2006)).

Figure 2:
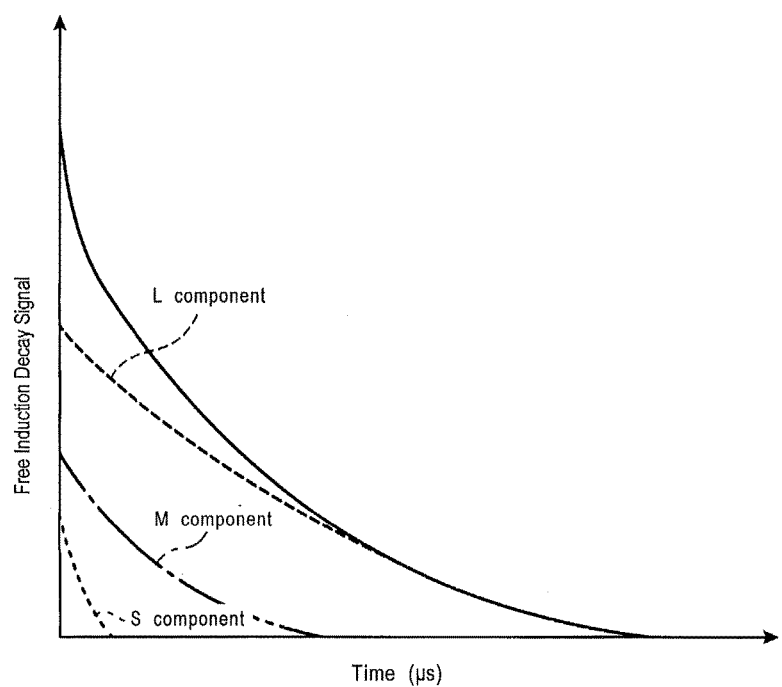
FIG. 2 is a diagram schematically showing a time-free induction decay signal curve obtained by measuring a polyurethane resin by a pulsed nuclear magnetic resonance method, and curves obtained by waveform separation of the curve into an amorphous phase (L component), an interface phase (M component), and a crystalline phase (S component) based on the difference in spin-spin relaxation time by using a least-squares method.

The details of the pulsed NMR measurement are as follows. First, a glass tube having a diameter of 1 cm filled with a sample cut into pieces of about 1 to 2 mm square to a height of 1 to 2 cm is placed in a magnetic field, and the relaxation behavior of macroscopic magnetization is measured after a high-frequency pulse magnetic field is applied. As a result, a free induction decay (FID) signal can be obtained as shown in FIG. 2 (horizontal axis: time (µs), vertical axis: free induction decay signal). The initial value of the obtained FID signal is proportional to the number of protons in the measured sample. When three components exist in the measured sample, the FID signal exists as the sum of response signals of the three components. Meanwhile, the components contained in the sample are different from each other in mobility, and hence different from each other in decay rate of the response signal and in spin-spin relaxation time T2. For this reason, the FID signal can be divided by the least-squares method into three components, namely, an amorphous phase (L component), an interface phase (M component), and a crystalline phase (S component) in descending order of spin-spin relaxation time T2 (see FIG. 2). The amorphous phase is a component having high molecular mobility; the crystalline phase is a component having low molecular mobility; and the intermediate component is the interface phase.

For the above-described pulsed NMR, the solid echo method, and the spin-spin relaxation time T2, reference can be made to Japanese Patent Application Publication No. 2007-238783 (especially, Paragraphs [0028] to [0033]).

The "spin-spin relaxation time (T2)" is used as an index of molecular mobility, and a larger numeric value indicates a higher mobility. In general, a crystalline phase has a low mobility, and hence a short T2. In contrast, an amorphous phase has a long T2. With increase in molecular weight of the diol, the mobility increases, and the T2 value increases.

The reason why the spin-spin relaxation time T2 is indicative of molecular mobility can be understood from the relationship between the T2 and the correlation time τc of molecular motion. The τc represents an average time at which molecules in a mobility state collide with each other, and it is known that the value of the T2 decreases with the increase in τc in an inversely proportional manner. This indicates that the T2 is shortened with the decrease in molecular mobility.

A "component amount (phase amount)" is the percentage (% by mass) of each phase, and a urethane becomes harder as the T2 of the amorphous phase decreases and as the ratio of the amorphous phase decreases. In addition, as the interface phase decreases, the phase separation between the crystalline phase and the amorphous phase are more clear in the structure, and the elasticity characteristics are more resistant to strain. In contrast, as the interface phase increases, the phase separation between the crystalline phase and the amorphous phase is less clear in the structure, and delayed elastic characteristics are exhibited.

(Spin-Spin Relaxation Time $T2_M$)

When a free induction decay signal (FID) of the polyurethane-polyurea resin foam of the present invention obtained by pulsed NMR is subjected to waveform separation by sequentially subtracting components in descending order of spin-spin relaxation time T2 based on a least-squares method, and thus divided into three components of L (amorphous phase), M (interface phase), and S (crystalline phase) in descending order of the spin-spin relaxation time T2 (when it is difficult to separate the M component and the L component from each other, the total of the M component and the L component is regarded as the M component), the M-component has a spin-spin relaxation time T2 (hereinafter, also referred to as $T2_M$) of 160 to 260 μs, preferably 160 to 250 μs, and more preferably 180 to 240 μs. If the $T2_M$ is shorter than the above-described range, the polishing uniformity deteriorates. On the other hand, if the $T2_M$ is longer than the above-described range, moderate dressing properties cannot be obtained, and scratches tend to be formed because of clogging of opening portions.

In the above, the expression "it is difficult to separate the M component and the L component from each other" means a case where the polyurethane-polyurea resin foam cannot be divided into three components in dividing the polyurethane-polyurea resin foam in descending order of T2. This is because the present invention relates to a soft urethane, and hence the ratio of the amorphous phase is inherently high, and the interface phase behaves in a similar manner to that of the amorphous phase. However, since the interface phase is never absent, these components are treated not as an amorphous phase but as an interface phase.

(Storage Elastic Modulus E')

In Description and Claims, the storage elastic modulus E' is measured according to JIS K 7244-4 with an initial load of 10 g, a strain range of 0.01 to 4%, and a measuring frequency of 0.2 Hz at 40° C.

The storage elastic modulus E' of the polyurethane-polyurea resin foam measured at 40° C. with an initial load of 10 g, a strain range of 0.01 to 4%, and a measuring frequency of 0.2 Hz in a tensile mode is 1 to 30 MPa, preferably 1 to 25 MPa, and most preferably 1 to 20 MPa. If the storage elastic modulus E' is below the above-described range, the pad itself tends to deform due to offset load temporarily applied during the polishing, which results in a poor polishing uniformity. Meanwhile, if the storage elastic modulus E' is above the above-described range, scratches tend to be formed, because of the lack of the elasticity.

(Density D)

The density D of the polyurethane-polyurea resin foam is 0.30 to 0.60 g/cm$^3$, more preferably 0.35 to 0.55 g/cm$^3$, and further more preferably 0.35 to 0.50 g/cm$^3$. When the density D is within the range, the possibility of the formation of scars due to the clogging of the polishing layer surface with a polishing agent or dust from a workpiece or the like is reduced. In contrast, if the density D is lower than the lower limit value, the planarization performances deteriorate, because the elasticity is excessively high, and hence the pad itself greatly deforms upon contact with a workpiece. On the other hand, if the density D is higher than the upper limit value, scratches are formed because of the lack of elasticity.

Especially because all the T2 ($T2_M$) of the M component, the storage elastic modulus E', and the density D are restricted to the above-described numeric value ranges, respectively, the present invention makes it possible to obtain a polishing pad excellent in all of the scratch reduction, the polishing rate, and the polishing uniformity.

(Component Amount ($C_M$) of M Component)

In addition to the above, the component amount ($C_M$) of the M component is preferably in a range from 55 to 80% (% by mass).

When the component amount of the M component is within the above-described range, a moderate amount of regions (M component) in which molecules are associated with each other by moderate cohesive force are contained. Hence, moderate dressing properties are created, so that scratches due to clogging of opening portions are reduced, and simultaneously the polishing uniformity is also retained. As the M component decreases, the strain decreases, and the rubber elasticity improves. However, in terms of the polishing characteristics, it is difficult to obtain a sufficient polishing rate, because the response of the stress against compression by polishing pressure is too high (too fast). On the other hand, if the M component is too much, the polishing uniformity is poor, because the response of the stress against the compression is too low (too slow). In contrast, if the M component is within the above-described range, it is possible to perform polishing excellent in both the polishing rate and the polishing uniformity because of a moderate delayed elasticity.

(X Value)

In addition to the above, it has been found as a result of intensive studies that when an X value determined by $X=T2_M/D$ is in a range from 350 to 800, the scratch reduction, the polishing rate, and the polishing uniformity can be achieved, while a certain polishing flatness is retained.

The X value is preferably in a range from 350 to 800, and more preferably from 380 to 600.

Here, a polishing pad constituted of a polyurethane-based resin having urea bonds moderately is highly likely to satisfy the above-described X value, and achieves excellent polishing characteristics. Hence, the X value presumably means an index of moderate softening of the polishing surface in a wet state because of urea bonds and the like (since this range results in a urethane-urea resin composition having urea bonds moderately, the resin composition is softened moderately in a wet state). Therefore, a localized load becomes less likely to be applied to a semiconductor wafer, and desirable operations and effects are achieved.

(Average Cell Diameter d)

In Description and Claims, the average cell diameter is an average value of equivalent circle diameters calculated from the areas of cell portions and the number of the cell portions obtained by binarization of a surface image of the polishing pad (note that this average value is a numeric value obtained in the case where the "cutoff value" for cutting noises is set to 10 μm in the image processing).

The average cell diameter d (μm) of the polyurethane-polyurea resin foam of the polishing layer is preferably 120 to 185 μm, more preferably 120 to 170 μm, and further more preferably 140 to 170 μm. If the average cell diameter (μm) is higher than the upper limit value, the polishing layer surface is so rough that the polishing quality of a workpiece deteriorates. If the average cell diameter (μm) is lower than the lower limit value, scratches tend to be formed, because of clogging of the polishing layer surface or loss of flexibility of the polishing layer surface.

(Type A Hardness and Type D Hardness)

In Description and Claims, the type A hardness means a value measured according to JIS K 7311.

Meanwhile, the type D hardness means a value measured according to JIS K 6253-1997/ISO 7619.

In addition, the type A hardness of the polyurethane-polyurea resin foam is preferably 20 to 55 degrees.

Meanwhile, the type D hardness of the polyurethane-polyurea resin foam is preferably 5 to 35 degrees.

If the type A hardness and/or the type D hardness is/are below the above-described range(s), the elasticity is excessively high, and hence the pad itself greatly deforms upon contact with a workpiece, resulting in a poor planarization performance. Meanwhile, if the type A hardness and/or the type D hardness exceed(s) the above-described range(s), scratches are formed, because of the lack of elasticity.

The polishing pad of the present invention can be suitably used for polishing a semiconductor device, and especially for chemical mechanical polishing (CMP) of a semiconductor device.

<<Method for Manufacturing Polishing Pad>>

A method for manufacturing a polishing pad for polishing a semiconductor device of the present invention by which the above-described polishing pad for polishing a semiconductor device of the present invention can be manufactured comprises: a preparation step of preparing an isocyanate, group-containing compound (A), a polyisocyanate compound (B), a polyamine compound (D), an aqueous dispersion (a mixture liquid comprising water, a foam stabilizer, and a reaction catalyst) (E), and a gas non-reactive with all the components; a mixing step of mixing at least the isocyanate group-containing compound (A), the polyisocyanate compound (B), the polyamine compound (D), the aqueous dispersion (E), and the gas non-reactive with all the components with each other to obtain a mixture liquid for molding a foam; a foam-molding step of molding a polyurethane-polyurea resin foam from the mixture liquid for molding a foam; and a polishing layer formation step of forming a polishing layer having a polishing surface for polishing a workpiece from the polyurethane-polyurea resin foam.

Hereinafter, the preparation step, the mixing step, the foam-molding step, and the polishing layer formation step are described separately.

<Preparation Step>

For manufacturing the polishing pad of the present invention, at least an isocyanate group-containing compound (A), a polyisocyanate compound (B), a polyamine compound (D), an aqueous dispersion (E), and a gas non-reactive with all of these components are used as raw materials of the polyurethane-polyurea resin foam. Moreover, a polyol compound may be used with the above-described components.

In addition, as long as the effects of the present invention are not impaired, components other than those described above may be used in combination.

Hereinafter, each of the components is described.

[(A) Isocyanate Group-Containing Compound]

The isocyanate group-containing compound, which is a prepolymer, is obtained by reacting the following polyisocyanate compound and polyol compound under ordinary conditions. In addition, other components may be contained in the isocyanate group-containing compound, as long as the effects of the present invention are not impaired.

As the isocyanate group-containing compound, a commercially available compound may be used, or a compound synthesized by reacting a polyisocyanate compound with a polyol compound may be used. The reaction is not particularly limited, and it is only necessary to carry out an addition polymerization reaction by employing a known method and conditions for manufacturing a polyurethane resin. For example, the isocyanate group-containing compound can be manufactured by a method in which a polyisocyanate compound heated to 50° C. is added to a polyol compound heated to 40° C. with stirring in a nitrogen atmosphere, the temperature is raised to 80° C. in 30 minutes, and the reaction is allowed to further proceed at 80° C. for 60 minutes.

In addition, when the polyisocyanate compound is added in excess of the polyol compound for manufacturing the isocyanate group-containing compound (A), the polyisocyanate compound remains in the reaction solution even after the formation of the isocyanate group-containing compound. Hence, the reaction solution can also be used in the subsequent mixing step, without additionally preparing the polyisocyanate compound in the preparation step.

[(B) Polyisocyanate Compound]

In Description and Claims, the polyisocyanate compound means a compound having two or more isocyanate groups in its molecule.

The polyisocyanate compound is not particularly limited, as long as it has two or more isocyanate groups in its molecule. Examples of diisocyanate compounds having two isocyanate groups in its molecule include m-phenylene diisocyanate, p-phenylene diisocyanate, 2,6-tolylene diisocyanate (2,6-TDI), 2,4-tolylene diisocyanate (2,4-TDI), naphthalene-1,4-diisocyanate, diphenylmethane-4,4'-diisocyanate (MDI), 4,4'-methylene-bis(cyclohexyl isocyanate) (hydrogenated MDI), 3,3'-dimethoxy-4,4'-biphenyl diisocyanate, 3,3'-dimethyldiphenylmethane-4,4'-diisocyanate, xylylene-1,4-diisocyanate, 4,4'-diphenylpropane diisocyanate, trimethylene diisocyanate, hexamethylene diisocyanate, propylene-1,2-diisocyanate, butylene-1,2-diisocyanate, cyclohexylene-1,2-diisocyanate, cyclohexylene-1,4-diisocyanate, p-phenylene diisothiocyanate, xylylene-1,4-diisothiocyanate, ethylidyne diisothiocyanate, and the like.

The polyisocyanate compound is preferably a diisocyanate compound, and, among diisocyanate compounds, 2,4-TDI and MDI are more preferable, and 2,4-TDI is particularly preferable.

One of these polyisocyanate compounds may be used alone, or multiple polyisocyanate compounds may be used in combination.

[(C) Polyol Compound]

In Description and Claims, the polyol compound means a compound having two or more alcoholic hydroxyl groups (OH) in its molecule.

((C-1) Polyol Compound for Prepolymer Synthesis)

The polyol compound used for synthesizing the isocyanate group-containing compound, which is a prepolymer, includes diol compounds, triol compounds, and the like such as ethylene glycol and butylene glycol; polyether polyol compounds such as poly(tetramethylene glycol) (PTMG); polyester polyol compounds such as a reaction product of ethylene glycol with adipic acid and a reaction product of butylene glycol with adipic acid; polycarbonate polyol compounds; polycaprolactone polyol compounds; and the like. Of these compounds, PTMG is preferable, and PTMG having a number average molecular weight (Mn) of approximately 500 to 5000 is further more preferable, and PTMG having a number average molecular weight (Mn) of approximately 1000 is most preferable.

One of the above-described polyol compounds may be used alone, or multiple polyol compounds may be used in combination.

In addition, the NCO equivalent weight of the prepolymer, which can be determined by "(the mass (parts) of the polyisocyanate compound+the mass (parts) of the polyol compound (C-1))/[(the number of functional groups per molecule of the polyisocyanate compound×the mass (parts) of the polyisocyanate compound/the molecular weight of the polyisocyanate compound)–(the number of functional groups per molecule of the polyol compound (C-1)×the mass (parts) of the polyol compound (C-1)/the molecular weight of the polyol compound (C-1))]," is a numeric value representing the molecular weight of the PP (prepolymer) per NCO group. The NCO equivalent weight is preferably 400 to 650.

((C-2) Polyol Compound which May be Used after Prepolymer Synthesis)

In addition, in the present invention, besides the polyol compound used for forming the isocyanate group-containing compound, which is the prepolymer, a polyol compound can also be added into a mixer and mixed with the isocyanate group-containing compound, the polyisocyanate compound, the polyamine compound, and the like. The polyol compound may be prepared by itself, or prepared as a mixture liquid with the polyamine compound, or added during the preparation of the aqueous dispersion. The polyol compound acts as a curing agent for curing the prepolymer. The polyol compound is incorporated by a competitive reaction with the polyamine compound. Thus, the polyol compound inhibits uneven chain elongation reaction of the polyamine compound among the blocks, and makes it easier to carry out the polymerization with less uneven degrees of polymerization.

As the polyol compound, compounds such as diol compounds and triol compounds can be used without any particularly limitation. In addition, the polyol compound may be the same as or different from the polyol compound used for forming the prepolymer.

Specific examples thereof include low-molecular weight polydiols such as ethylene glycol, diethylene glycol, triethylene glycol, 1,2-propanediol, 1,3-propanediol, 1,3-butanediol, 1,4-butanediol, neopentyl glycol, pentanediol, 3-methyl-1,5-pentanediol, and 1,6-hexanediol; high molecular weight polyol compounds such as poly(tetramethylene glycol), polyethylene glycol, and poly(propylene glycol); and the like. Of these polyols, two-functional or three-functional poly(propylene glycol) (PPG) (here, three-functional poly(propylene glycol) means poly(propylene glycol) having a branch obtained by using, as a polymerization initiator, glycerin having multiple functional groups) and poly(tetramethylene glycol) are preferable from the viewpoints of the compatibility with the other components in the mixing step and the uniformity of the obtained cells. Poly(propylene glycol) and/or poly(tetramethylene glycol) having a number average molecular weight (Mn) of approximately 500 to 5000 are/is more preferable, poly(propylene glycol) having an Mn of approximately 2000 to 4000 and/or poly(tetramethylene glycol) having an Mn of approximately 500 to 1500 are/is further preferable, and poly(propylene glycol) having a Mn of approximately 3000 and/or poly(tetramethylene glycol) having an Mn of approximately 1000 are/is most preferable. In addition, the poly(propylene glycol) is preferably three-functional poly(propylene glycol).

One of the polyol compounds (C-2) may be used alone, or multiple polyol compounds (C-2) may be used in combination.

When the polyol compound (C-2) is used, the polyol compound (C-2) is preferably prepared, with the equivalence ratio (hereinafter, referred to also as an s value) of the amino groups of the polyamine compound to the sum of the chemical equivalents of the amino groups of the polyamine compound described later and the hydroxyl groups of the polyol compound prepared separately from the isocyanate group-containing compound (the chemical equivalent of active hydrogen groups) being 0.70 to 0.97 (the amino groups/(the amino groups+the hydroxyl groups)).

One of the polyol compounds may be used alone, or multiple polyol compounds may be used in combination.

[(D) Polyamine Compound]

In Description and Claims, the polyamine compound means a compound having two or more amino groups in its molecule.

The polyamine compound acts as a chain extender. Part of the polyamine compound reacts with the polyisocyanate compound to form hard segments, and other part of the polyamine compound is bonded to terminals of main chains of the isocyanate group-containing compound (soft segment portions), so that the polymer chains can be further extended. Thus, a polyurethane-polyurea resin having a block copolymer of hard segments and soft segments is formed.

As the polyamine compound, an aliphatic or aromatic polyamine compound, and especially a diamine compound can be used. Examples of the polyamine compound include ethylenediamine, propylenediamine, hexamethylenediamine, isophoronediamine, dicyclohexylmethane-4,4'-diamine, 3,3'-dichloro-4,4'-diaminodiphenylmethane (methylenebis(o-chloroaniline)) (hereinafter, abbreviated as MOCA), polyamine compounds having structures similar to that of MOCA, and the like. In addition, the polyamine compound may have a hydroxyl group, and examples of such an amine-based compound include 2-hydroxyethylethylenediamine, 2-hydroxyethylpropylenediamine, di-2-hydroxyethylethylenediamine, di-2-hydroxyethylpropylenediamine, 2-hydroxypropylethylenediamine, di-2-hydroxypropylethylenediamine, and the like.

The polyamine compound is preferably a diamine compound, more preferably MOCA, diaminodiphenylmethane, or diaminodiphenyl sulfone, and particularly preferably MOCA.

Here, solid MOCA and crude MOCA are known as the MOCA. The solid MOCA means pure MOCA, which is solid at room temperature. The crude MOCA is a mixture of monomer of MOCA and multimers of MOCA, and a crude MOCA in which the ratio of the multimers is 15% by mass or higher is preferably used. The ratio of the multimers is more preferably 10 to 50% by mass, and further more preferably 20 to 40% by mass. Examples of the multimers include dimer, trimer, and tetramer of MOCA, and the like. The crude MOCA makes it easier to control the reaction rate, and consequently makes it easier to obtain physical properties (for example, density, hardness, and the like) uniform all over the foam.

"Solid MOCA" and "crude MOCA" used in Description and Claims mean the above-described solid MOCA and the above-described crude MOCA, respectively.

One of the polyamine compounds may be used alone, or multiple polyamine compounds may be used in combination. In addition, since the solid MOCA and the crude MOCA are solid at normal temperature, the solid MOCA and the crude MOCA have to be used in a molten state in the mixing step by heating at about 120° C. In this respect, when the polyol compound (C-2) is used, it is preferable to use the MOCA, particularly the crude MOCA, dissolved in the polyol compound (C-2) in advance, because the MOCA can be used in the mixing step without heating to the melting temperature, and uneven polymerization due to the increase in reactivity by the heating can be suppressed. When the MOCA is used by being dissolved as described above, the mass ratio of the MOCA to the polyol compound (C-2) is preferably 3:1 to 1:3, more preferably 2:1 to 1:2, and particularly preferably 1:1.

Moreover, the polyol compound (C-2) in which the MOCA is dissolved is preferably poly(tetramethylene glycol), more preferably poly(tetramethylene glycol) having a number average molecular weight (Mn) of approximately 500 to 5000, further preferably poly(tetramethylene glycol) having an Mn of approximately 500 to 1500, and most preferably poly(tetramethylene glycol) having an Mn of approximately 1000.

In order to facilitate the mixing of the polyamine compound with the other components and/or improve the uniformity of the cell diameters in the subsequent foam-molding step, the polyamine compound is preferably degassed under reduced pressure, if necessary, in a heated state. As the degassing method under reduced pressure, a method known for manufacturing a polyurethane-polyurea may be used. For example, the polyamine compound can be degassed by using a vacuum pump at a degree of vacuum of 0.1 MPa or less.

When a solid compound is used as the chain extender, the compound can be degassed under reduced pressure, while being melt by heating.

On the other hand, when a polyamine compound which is liquid at room temperature is used, the polyamine compound may be degassed under reduced pressure without heating.

In the method for manufacturing a polishing pad of the present invention, the content ratio (molar ratio or equivalence ratio) of the polyamine compound to the polyol compound used for forming the prepolymer and/or all the polyol compounds is extremely smaller than the content ratios employed in conventional manufacturing of polishing pads.

Specifically, when the solid MOCA is used as the polyamine compound, the solid MOCA is preferably used in an amount of 150 to 205 parts by mass relative to 1000 parts by mass which is the total of the polyisocyanate compound and the polyol compound (C-1). When a liquid MOCA (details thereof are described later) is used as the polyamine compound, the liquid MOCA is preferably used in an amount of 200 to 400 parts by mass relative to 1000 parts by mass which is the total of the polyisocyanate compound and the polyol compound (C-1).

[(E) Aqueous Dispersion]

In Description and Claims, the aqueous dispersion means a mixture liquid comprising water, a foam stabilizer, and a reaction catalyst.

The aqueous dispersion contributes as a blowing agent and a catalyst for addition polymerization and to foam stabilization associated with foam diameters and foam uniformity. For example, the aqueous dispersion can be prepared by stirring and mixing water, a reaction catalyst, a surfactant, and the like by using an ordinary stirrer. Of course, the aqueous dispersion is not limited to only those consisting of the combination of these three components.

Water contained in the aqueous dispersion is preferably distilled water from the viewpoint of preventing contamination with impurities. The water is used at a ratio of preferably 0.1 to 6 parts by mass, more preferably 0.5 to 5 parts by mass, and further more preferably 1 to 3 parts by mass, relative to 1000 parts by mass of the prepolymer.

As the reaction catalyst (hereinafter, sometimes simply referred to also as a catalyst) contained in the aqueous dispersion, a known reaction catalyst can be used. Examples of the catalyst include amine catalysts such as tertiary amines, alcohol-amines, and ether-amines (for example, TOYOCAT-ET); acetates (of potassium or calcium), orga-nometallic catalysts, and the like. Note that, in Examples, bis(2-dimethylaminoethyl)ether (TOYOCAT-ET manufactured by Tosoh Corporation) was used as the catalyst. However, the effects of the present invention are not limited to cases where this catalyst is used. The amount of the catalyst is not particularly limited, and is used at a ratio of preferably 0.01 to 5 parts by mass, and more preferably 0.5 to 3 parts by mass, relative to 1000 parts by mass of the prepolymer.

As the surfactant serving as a foam stabilizer and contained in the aqueous dispersion, a known surfactant can be used. Examples of the surfactant include polyether-modified silicones and the like. Note that, in Examples, SH-193 (manufactured by Dow Corning Corporation), which is one of the silicone-based surfactants, was used. However, the effects of the present invention are not limited to cases where this surfactant is used. The amount of the surfactant is not particularly limited, and is preferably 0.1 to 10 parts by mass, and more preferably 0.5 to 5 parts by mass, relative to 1000 parts by mass of the prepolymer.

Moreover, in addition to the above-described components, known flame retardant, coloring agent, plasticizer, and the like may be contained in the aqueous dispersion, as long as the effects of the present invention are not impaired.

<Mixing Step>

In the mixing step, the isocyanate group-containing compound (prepolymer) (A), the polyisocyanate compound (B), the polyamine compound (D), and the aqueous dispersion (E) obtained in the preparation step and the prepolymer formation step are supplied to a mixer. Here, the gas non-reactive with all the components is introduced into the components. The supplied non-reactive gas is stirred and mixed with the above-described components in the mixer, so that a mixture liquid for molding a foam in which bubbles are formed is prepared. The mixing step is conducted with heating to a temperature at which the above-described components can retain their flowability.

For example, solid MOCA (120° C.) or MOCA (80° C.) dissolved in the polyol compound (C-2) and a dispersion containing the catalyst, and the like may be added to a prepolymer (isocyanate) solution heated to 30° C. to 100° C. in a mixer equipped with a jacket capable of temperature adjustment, and the mixture liquid may be stirred at 80° C.

If necessary, the mixture liquid may be transferred to a tank equipped with an agitator and a jacket, and aged. The stirring time is adjusted, as appropriate, depending on the number of the blades, the number of revolutions, the clearance, and the like of the mixer, and is, for example, 0.5 to 600 seconds.

As the gas, any gas non-reactive with all the above-described components can be used without limitation. For example, air, nitrogen, oxygen, carbon dioxide, helium, argon, and the like can be used.

Regarding the amount of the gas supplied, the supply rate and the supply time are adjusted, so that the amount of the gas supplied can be in a range of preferably 0.10 to 4.00 L, and more preferably 0.17 to 3.33 L per kilogram of the total amount of the above-described components.

<Foam-Molding Step>

In the foam-molding step, a polyurethane-polyurea resin foam is molded by pouring the mixture liquid for molding a foam prepared in the mixing step into a mold heated at 50 to 100° C. to thereby foam and cure the mixture liquid. Here, the prepolymer, the polyisocyanate compound, and the polyamine compound (and the polyol compound) react with each other to form the polyurethane-polyurea resin, and thus the mixture liquid is cured. Here, water contained in the aqueous dispersion reacts with isocyanate groups in the prepolymer to generate carbon dioxide. The generated carbon dioxide and the introduced gas remain in the polyurethane-polyurea resin, so that a polyurethane-polyurea resin foam as shown in FIG. 1 having many substantially spherical and fine cells is formed.

Note that, in FIG. 1, the photographs of a cross-sectional view (left) of a polishing pad showing an embodiment of the present invention and a cross-sectional view (right) of a polishing pad (Comparative Example 1) having a polishing layer dry-molded by a conventional technique were taken at the same magnification (×100), and the white bar in the right photograph represents a length of 100 μm.

<Polishing Layer Formation Step>

The polyurethane-polyurea resin foam obtained in the foam-molding step is sliced into a sheet shape. Thus, a polyurethane-polyurea sheet is formed. By this slicing, openings are formed on the sheet surface. Here, to form openings excellent in wear resistance and resistant to clogging on the polishing layer surface, it is preferable to conduct aging at 30 to 80° C. for about 1 hour to 2 weeks. The aging makes it easier to obtain desired elasticity characteristics. Here, the average cell diameter in the foam is preferably set within the above-described range, i.e., 120 to 185 μm, and preferably 120 to 170 μm, and further preferably 140 to 170 μm. The average cell diameter can be adjusted within the above-described range by controlling the temperature (viscosity) of the prepolymer, the number of revolutions of the stirring, the air flow rate, the type and the concentration of the foam stabilizer, and the mold temperature.

Then, after a double-sided tape is attached onto a surface of the thus obtained polishing layer having a polyurethane-polyurea sheet, the surface being opposite from the polishing surface of the polishing layer, the polishing layer is cut into a given shape, preferably a disk shape, and completed as a polishing pad of the present invention. The double-sided tape is not particularly limited, and any double-sided tape selected from double-sided tapes known in this technical field can be used.

In addition, the polishing pad of the present invention may have a single-layer structure consisting only of the polishing layer, or may be composed of multiple layers by laminating another layer (underlying layer, supporting layer) on the surface of the polishing layer opposite from the polishing surface. The characteristics of said another layer are not particularly limited, and it is preferable to laminate a layer harder (having a higher type A hardness and/or a higher type D hardness) than the polishing layer on the surface opposite from the polishing layer. By providing the layer harder than the polishing layer, the influence of fine asperity on the polishing platen on the shape of the polishing surface can be avoided, so that the polishing flatness is further improved. Moreover, the rigidity of the polishing cloth is generally increased, so that the formation of winkles and the like can be prevented at the time of attachment of the polishing cloth onto the platen.

When the polishing pad of the present invention has a multi-layer structure, the multiple layers may be adhered and fixed to each other by using a double-sided tape or an adhesive agent, if necessary, under pressure. The double-sided tape or the adhesive agent used here is not particularly limited, and any double-sided tape or adhesive agent selected from those known in this technical field can be used.

Moreover, if necessary, the polishing pad of the present invention may be subjected to a grinding treatment on the front surface and/or the back surface of the polishing layer, or grooving or embossing on the front surface. Moreover, a substrate and/or an adhesive layer may be laminated on the polishing layer, and the polishing layer may include a light-transmission portion.

The grinding method is not particularly limited, and the grinding can be conducted by a known method. Specifically, the grinding may be conducted by using sandpaper.

The pattern achieved by the grooving or embossing is not particularly limited, and examples of the pattern include a lattice pattern, a concentric-circular pattern, a radial pattern, and the like.

When the polishing pad of the present invention is used, the polishing pad is attached to a polishing platen of a polishing machine, with the polishing surface of the polishing layer facing a workpiece. Then, while a polishing agent slurry is supplied, the polishing platen is rotated. Thus, the work surface of the workpiece is polished.

The workpiece to be processed by the polishing pad of the present invention may be a glass substrate for a hard disk, mother glass for a thin display, a semiconductor wafer, a semiconductor device, or the like. Especially, the polishing pad of the present invention is suitably used for processing a semiconductor device.

<<Operations and Effects>>

The CMP polishing pad of the present invention comprises a polishing layer containing a polyurethane-polyurea resin foam.

When a free induction decay signal (FID) of the polyurethane-polyurea resin foam obtained by pulsed NMR is subjected to waveform separation by sequentially subtracting components in descending order of pulse-pulse relaxation time T2 based on a least-squares method, and thus divided into three components of L (amorphous phase), M (interface phase), and S (crystalline phase) in descending order of pulse-pulse relaxation time T2 (when it is difficult to separate the M component and the L component from each other, the total of the M component and the L component is regarded as the M component), the M-component has a spin-spin relaxation time T2 (hereinafter, referred to as $T2_M$ in some cases) of 160 to 260 μs;

the polyurethane-polyurea resin foam has a storage elastic modulus E' of 1 to 30 MPa, the storage elastic modulus E' being measured at 40° C. with an initial load of 10 g, a strain range of 0.01 to 4%, and a measuring frequency of 0.2 Hz in a tensile mode; and the density D of the polyurethane-polyurea resin foam is set within the range from 0.30 to 0.60 g/cm$^3$.

Since the polishing layer made of a polyurethane-polyurea resin satisfying the above described ranges has a $T2_M$ within the predetermined range, the polishing layer has moderate dressing properties, can reduce the formation of scratches due to clogging of openings, and simultaneously can secure necessary flatness. Since the polishing layer has a lower storage elastic modulus and a lower density than hard polyurethane polishing layers molded by conventional dry methods, the obtained polishing pad has a lower hardness than conventional ones. Hence, the strong pressing of the polishing layer to a workpiece is suppressed, and scratches are less likely to be formed on a surface of a workpiece.

On the other hand, in the polishing pad of the present invention, openings having the shapes obtained by slicing the substantially spherical cells are provided, and the polishing pad of the present invention has an isotropic cell structure uniform in the thickness direction and the plane direction of the polishing layer. Hence, the polishing pad of the present invention has a different pore (opening) shape on the polishing layer surface from that of a polishing pad (abbreviated as a soft (wet) polishing pad) molded by a conventional wet method and having an anisotropic foam structure having relatively large opening portions of a suede type. A soft (wet) polishing pad has a structure in which the cell diameter gradually increases from the polishing surface to the bottom portion. Hence, the soft (wet) polishing pad has a problem that, as the polishing pad wears with polishing, the cell diameter (the diameters of the openings) on the surface increases, and the surface becomes rough, so that the polishing quality deteriorates. In addition, since the cells become larger to the bottom portion in this structure, the soft (wet) polishing pad has a problem that the surface is worn by tearing off due to the polishing resistance. In contrast, since the polishing pad of this invention is molded by a dry method, the cells are isotropic. Hence, the polishing pad of this invention achieves an effect of reducing the occurrence of the above-described problems observed in the wet polishing pad.

As described above, since the polishing pad of the present invention has moderate dressing properties, the openings are resistant to clogging. Since the polishing pad of the present invention is softer and has lower density than conventional hard (dry) polishing pads, the formation of scratches can be reduced. Since the polishing pad of the present invention is also excellent in polishing rate and polishing uniformity, the polishing pad can be used not only for primary processing, but also for finish processing. Moreover, when the X value is limited to the certain range, urea bonds are moderately introduced into the molecule, and hence the polishing surface becomes moderately softened in a wet state. Therefore, formation of scratches is reduced. On the other hand, since the inside of the polyurethane resin foam not in a wet state retains the hardness, a polishing flatness is secured.

EXAMPLES

Hereinafter, the present invention will be described in further detail based on examples. However, the present invention is not limited to these examples.

In each of Examples and Comparative Example, as well as Tables 1 to 4, "parts" means "parts by mass," unless otherwise noted.

In addition, the abbreviations in Tables 1 to 4 have the following meanings.

2,4-TDI: 2,4-tolylene diisocyanate
Hydrogenated MDI: 4,4'-methylene-bis(cyclohexyl isocyanate)
PTMG 1000: poly(tetramethylene glycol) having a number average molecular weight of approximately 1000
DEG: diethylene glycol
MOCA: 3,3'-dichloro-4,4'-diaminodiphenylmethane
Three-functional PPG 3000: three-functional poly(propylene glycol) having a number average molecular weight of 3000

In addition, the NCO equivalent weight of a PP (prepolymer) is a numeric value representing the molecular weight of the PP per NCO group, and is determined by "(the mass (parts) of the polyisocyanate compound+the mass (parts) of the polyol compound (C-1))/[(the number of functional groups per molecule of the polyisocyanate compound×the mass (parts) of the polyisocyanate compound/the molecular weight of the polyisocyanate compound)−(the number of functional groups per molecule of the polyol compound (C-1)×the mass (parts) of the polyol compound (C-1)/the molecular weight of the polyol compound (C-1))]."

The s value is, as described above, a numeric value representing the equivalence ratio (amino groups/(amino groups+hydroxyl groups)) of the amino groups of the polyamine compound (D) to the sum (the chemical equivalent of active hydrogen groups) of the chemical equivalents of the amino groups of the polyamine compound (D) and the hydroxyl groups of the polyol compound (C-2) prepared separately from the isocyanate group-containing compound (A).

Note that the crude MOCA used in the following Examples and Comparative Examples was a liquid mixture (hereinafter, referred to as a liquid MOCA) of PTMG 1000 and a crude MOCA (multimer content: 40% by mass) at a mass ratio of 1:1.

Comparative Example 1

In Comparative Example 1, a conventionally known hard (dry) polishing pad was manufactured. As a first component, which was a prepolymer, an isocyanate group-containing urethane prepolymer having an isocyanate content of 9.0% and an NCO equivalent weight of 466 was used. This prepolymer was obtained by reacting 316 parts of 2,4-TDI, 88 parts of hydrogenated MDI, and 539 parts of the PTMG having a number average molecular weight of approximately 1000, then adding 57 parts of diethylene glycol thereto, and allowing the reaction to further proceed. This prepolymer was heated to 55° C., and degassed under reduced pressure. As a second component, which was a chain extender, a solid MOCA was melted at 120° C., and degassed under reduced pressure. As a third component, a blowing agent (Expancel 551 DE) was mixed with the first component at 2% by weight, and the first component and the second component were supplied to a mixer at a weight ratio of 1000 parts:256 parts.

The obtained mixture liquid was poured into a 890×890-mm mold heated to 50° C., and cured by heating at 100° C. for 5 hours. Then, the formed polyurethane resin foam was taken out of the mold. Moreover, this foam was sliced into sheets having a thickness of 1.25 mm. Thus, urethane sheets were fabricated, and polishing pads were obtained.

Examples 1 to 4 and Comparative Examples 2 to 5

Next, various polishing pads having different densities were manufactured by using solid MOCA and changing the ratio of components as shown in Table 1.

Example 1

In Example 1, as a first component, which was a prepolymer, an isocyanate group-containing urethane prepolymer having an isocyanate content of 7.8% and an NCO equivalent weight of 540 was used. The prepolymer was obtained by reacting 2,4-TDI (286 parts) and the PTMG (714 parts) having a number average molecular weight of approximately 1000. This prepolymer was heated to 55° C., and degassed under reduced pressure. As a second component, which was a chain extender, solid MOCA was used. The solid MOCA was melt at 120° C., and degassed under reduced pressure. A third component, an aqueous dispersion, was obtained by mixing the three-functional PPG (42 parts) having a number average molecular weight of 3000, water (3 parts), a catalyst (TOYOCAT-ET manufactured by Tosoh Corporation) (1 part), a silicone-based surfactant (SH-193 manufactured by Dow Corning Corporation) (1 part) with each other at 35° C. for 1 hour with stirring. Then, the aqueous dispersion was degassed under reduced pressure. The first component, the second component, and the third component were supplied to a mixer at a weight ratio of 1000 parts:168 parts:47 parts and at a flow rate of 80 kg/min. Here, air was supplied at a flow rate of 18.2 L/min through nozzles provided to a stirring rotor of the mixer (specifically, 18.2 L of air was supplied per 80 kg of the total of the first to third components). The obtained mixture liquid was poured into a mold (890×890 mm), and cured at 100° C. for 5 hours. Then, the formed polyurethane resin foam was taken out of the mold. This foam was sliced into sheets having a thickness of 1.35 mm. Thus, urethane sheets were fabricated, and polishing pads were obtained.

Examples 2 to 4 and Comparative Examples 2 to 5

Polishing pads having thicknesses of 1.32 to 1.35 mm were obtained by the same method as in Example 1, except that the ratio of components supplied into the mixer was changed as shown in Table 1.

TABLE 1

| <<Composition>> | | Comp. Ex. 1 | Comp. Ex. 2 | Ex. 1 | Ex. 2 | Ex. 3 | Ex. 4 | Comp. Ex. 3 | Comp. Ex. 4 | Comp. Ex. 5 |
|---|---|---|---|---|---|---|---|---|---|---|
| | NCO equivalent weight of PP | 466.0 | 540.0 | 540.0 | 540.0 | 540.0 | 540.0 | 540.0 | 540.0 | 540.0 |
| Prepolymer (1st component) | 2,4-TDI (parts) | 316 | 286 | 286 | 286 | 286 | 286 | 286 | 286 | 286 |
| | Hydrogenated MDI (parts) | 88 | | | | | | | | |
| | PTMG 1000 (parts) | 539 | 714 | 714 | 714 | 714 | 714 | 714 | 714 | 714 |
| | DEG (parts) | 57 | | | | | | | | |
| Chain extender (2nd component) | Liquid MOCA (parts) | | | | | | | | | |
| | Solid MOCA (parts) | 256 | 106 | 168 | 186 | 190 | 204 | 208 | 212 | 215 |
| Aqueous dispersion (3rd component) | Three-functional PPG 3000 (parts) | | 38 | 42 | 43 | 43 | 44 | 45 | 45 | 45 |
| | Water (parts) | | 8 | 3 | 2 | 2 | 1 | 1 | 0 | 0 |
| | TOYOCAT-ET (parts) | | 1 | 1 | 1 | 1 | 1 | 1 | 1 | 1 |
| | Silicone-based surfactant SH-193 (parts) | | 1 | 1 | 1 | 1 | 1 | 1 | 1 | 1 |
| | Air loading rate (L/min.) | | 18.2 | 18.2 | 18.2 | 18.2 | 18.2 | 18.2 | 18.2 | 18.2 |
| <<Physical properties>> | $T2_M$ (µs) | 120.0 | 191.0 | 193.0 | 195.0 | 195.0 | 195.0 | 196.0 | 198.0 | 200.0 |
| | $E'_{40}$ (MPa) (40° C.) | 299 | 1 | 5 | 9 | 11 | 20 | 31 | 48 | 46 |
| | Density D (g/cm$^3$) | 0.80 | 0.22 | 0.33 | 0.38 | 0.40 | 0.50 | 0.61 | 0.68 | 0.73 |
| | $C_M$ (% by mass) | 45.0 | 62.0 | 63.0 | 63.0 | 63.0 | 63.0 | 63.0 | 64.0 | 64.0 |
| | X value (=$T2_M$/D) | 150 | 868 | 585 | 513 | 488 | 390 | 321 | 291 | 274 |
| | S value | 1.00 | 0.97 | 0.97 | 0.97 | 0.97 | 0.97 | 0.97 | 0.97 | 0.97 |
| | Type A hardness (°) | 80 | 16 | 31 | 42 | 48 | 55 | 73 | 82 | 85 |
| | Type D hardness (°) | 57 | 3 | 15 | 25 | 32 | 34 | 50 | 58 | 60 |
| | Average cell diameter d (µm) | 30 | 190 | 162 | 149 | 143 | 129 | 119 | 97 | 89 |
| | Number of cells/mm$^2$ | 480 | 20 | 31 | 35 | 39 | 41 | 49 | 69 | 79 |
| | Thickness (mm) | 1.25 | 1.34 | 1.35 | 1.34 | 1.34 | 1.32 | 1.34 | 1.35 | 1.34 |
| <<Polishing test>> | Polishing rate (nm/min) | 229.7 (Good) | 168.8 (Poor) | 231.2 (Good) | 229.4 (Good) | 232 (Good) | 228.1 (Good) | 220.8 (Good) | 220.2 (Good) | 211.9 (Good) |
| | Polishing uniformity (CV %) | 12.7 (Poor) | 9.0 (Poor) | 6.8 (Good) | 4.6 (Good) | 4.8 (Good) | 5.3 (Good) | 8.6 (Poor) | 10.6 (Poor) | 11.7 (Poor) |
| | Presence or absence of scratches (in 5 substrates) | Present (2) (Poor) | Absent (0) (Good) | Absent (0) (Good) | Absent (0) (Good) | Absent (0) (Good) | Absent (0) (Good) | Absent (0) (Good) | Present (3) (Poor) | Present (3) (Poor) |

In Comparative Example 1, 2% by weight of Expancel 551 DE was added as a blowing agent.
Liquid MOCA means a liquid mixture of PTMG and crude MOCA (multimer content: 40% by mass) at a mass ratio of 1:1.

Examples 5 to 9 and Comparative Examples 6 to 8

Next, various polishing layers having different densities were manufactured by using a liquid MOCA, and by changing the ratio of components as shown in Table 2.

Example 5

In Example 5, as a first component, which was a prepolymer, an isocyanate group-containing urethane prepolymer having an isocyanate content of 7.8% and an NCO equivalent weight of 540 was used. The prepolymer was obtained by reacting 2,4-TDI (286 parts) and the PTMG (714 parts)

Examples 6 to 9 and Comparative Examples 6 to 8

Polishing pads having thicknesses of 1.28 to 1.30 mm were obtained in the same manner as in Example 5, except that the ratio of components supplied to the mixer was changed as shown in Table 2.

TABLE 2

| <<Composition>> | | Comp. Ex. 6 | Ex. 5 | Ex. 6 | Ex. 7 | Ex. 8 | Ex. 9 | Comp. Ex. 7 | Comp. Ex. 8 |
|---|---|---|---|---|---|---|---|---|---|
| | NCO equivalent weight of PP | 540.0 | 540.0 | 540.0 | 540.0 | 540.0 | 540.0 | 540.0 | 540.0 |
| Prepolymer (1st component) | 2,4-TDI (parts) | 286 | 286 | 286 | 286 | 286 | 286 | 286 | 286 |
| | Hydrogenated MDI (parts) | | | | | | | | |
| | PTMG 1000 (parts) | 714 | 714 | 714 | 714 | 714 | 714 | 714 | 714 |
| | DEG (parts) | | | | | | | | |
| Chain extender (2nd component) | Liquid MOCA (parts) | 153 | 234 | 273 | 281 | 290 | 295 | 301 | 304 |
| | Solid MOCA (parts) | | | | | | | | |
| Aqueous dispersion (3rd component) | Three-functional PPG 3000 (parts) | 37 | 41 | 42 | 43 | 43 | 43 | 43 | 44 |
| | Water (parts) | 7 | 3 | 2 | 1 | 1 | 1 | 0 | 0 |
| | TOYOCAT-ET (parts) | 1 | 1 | 1 | 1 | 1 | 1 | 1 | 1 |
| | Silicone-based surfactant SH-193 (parts) | 4 | 4 | 4 | 4 | 4 | 4 | 4 | 4 |
| | Air loading rate (L/min.) | 19.1 | 19.1 | 19.1 | 19.1 | 19.1 | 19.1 | 19.1 | 19.1 |
| <<Physical properties>> | $T2_M$ (μs) | 182.0 | 209.0 | 232.0 | 224.0 | 226.0 | 228.0 | 230.0 | 231.0 |
| | $E'_{40}$ (MPa) (40° C.) | 1 | 2 | 2 | 2 | 4 | 10 | 36 | 48 |
| | Density D (g/cm$^3$) | 0.12 | 0.33 | 0.39 | 0.41 | 0.49 | 0.54 | 0.69 | 0.75 |
| | $C_M$ (% by mass) | 60.0 | 66.0 | 73.0 | 70.0 | 71.0 | 71.0 | 72.0 | 72.0 |
| | X value (=$T2_M$/D) | 1517 | 633 | 595 | 546 | 461 | 422 | 333 | 308 |
| | S value | 0.74 | 0.73 | 0.72 | 0.72 | 0.71 | 0.71 | 0.71 | 0.70 |
| | Type A hardness (°) | 10 | 22 | 25 | 31 | 47 | 53 | 78 | 85 |
| | Type D hardness (°) | 4 | 6 | 8 | 11 | 27 | 33 | 54 | 60 |
| | Average cell diameter d (μm) | 224 | 178 | 168 | 158 | 142 | 123 | 96 | 88 |
| | Number of cells/mm$^2$ | 15 | 25 | 28 | 30 | 35 | 45 | 69 | 80 |
| | Thickness (mm) | 1.29 | 1.28 | 1.30 | 1.28 | 1.29 | 1.28 | 1.30 | 1.28 |
| <<Polishing test>> | Polishing rate (nm/min) | 181.2 (Poor) | 211.1 (Good) | 213.4 (Good) | 218.6 (Good) | 221.1 (Good) | 217.3 (Good) | 212.2 (Good) | 201.2 (Good) |
| | Polishing uniformity (CV %) | 11.2 (Poor) | 7.6 (Fair) | 4.6 (Good) | 4.2 (Good) | 4.8 (Good) | 7.8 (Fair) | 10.3 (Poor) | 10.9 (Poor) |
| | Presence or absence of scratches (in 5 substrates) | Present (1) (Poor) | Absent (0) (Good) | Absent (0) (Good) | Absent (0) (Good) | Absent (0) (Good) | Absent (0) (Good) | Present (3) (Poor) | Present (3) (Poor) | having a number average molecular weight of approximately 1000. This prepolymer was heated to 55° C., and degassed under reduced pressure. As a second component, which was a chain extender, the liquid MOCA (234 parts) was degassed under reduced pressure. A third component, an aqueous dispersion, was obtained by mixing the three-functional PPG (41 parts) having a number average molecular weight of 3000, water (3 parts), a catalyst (TOYOCAT-ET manufactured by Tosoh Corporation) (1 part), and a silicone-based surfactant (SH-193 manufactured by Dow Corning Corporation) (4 parts) with each other with stirring. Then, the aqueous dispersion was degassed under reduced pressure. The first component, the second component, and the third component were supplied to a mixer at a weight ratio of 1000 parts:234 parts:49 parts and at a flow rate of 80 kg/min. Here, air was supplied into the mixer at a flow rate of 19.1 L/min through nozzles provided to a stirring rotor (specifically, 19.1 L or air was supplied per 80 kg of the total of the first to third components). The obtained mixture liquid was poured into a mold, and cured at 100° C. for 5 hours. Then, the formed polyurethane resin foam was taken out of the mold. This foam was sliced into sheets having a thickness of 1.28 mm. Thus, urethane sheets were fabricated, and polishing pads were obtained.

Examples 10 to 15 and Comparative Examples 9 to 13

Finally, polishing layers were manufactured by increasing or decreasing the amounts of the polyisocyanate compound, the polyol compound, and the polyamine compound.

Example 10

In Example 10, as a first component, which was a prepolymer, an isocyanate group-containing urethane prepolymer having an isocyanate content of 10.0% and an NCO equivalent weight of 420 was used. The prepolymer was obtained by reacting 2,4-TDI (325 parts) and the PTMG (675 parts) having a number average molecular weight of approximately 1000. This prepolymer was heated to 55° C., and degassed under reduced pressure. As a second component, which was a chain extender, the liquid MOCA (397 parts) was degassed under reduced pressure. A third component, an aqueous dispersion, was obtained by mixing the three-functional PPG (43 parts) having a number average molecular weight of 3000, water (1 part), a catalyst (TOYOCAT-ET manufactured by Tosoh Corporation) (1 part), and a silicone-based surfactant (SH-193 manufactured by Dow Corning Corporation) (4 parts) with each other with stirring. Then, the aqueous dispersion was degassed under reduced pressure. The first component, the second component, and the third component were supplied to a mixer at a weight ratio of 1000 parts:397 parts:49 parts and at a flow rate of 80 kg/min. Here, air was supplied into the mixer at a flow rate of 19.1 L/min. The obtained mixture liquid was poured into a mold and cured. Then, the formed polyurethane resin foam was taken out of the mold. This foam was sliced into sheets having a thickness of 1.27 mm. Thus, urethane sheets were fabricated, and polishing pads were obtained.

Examples 11 to 15 and Comparative Examples 9 to 13

In Examples 11 to 15 and Comparative Examples 9 to 13, polishing pads having thicknesses of 1.27 to 1.30 mm were manufactured by the same method as in Example 10, except that the ratio of components was changed as shown in Table 3 or 4.

TABLE 3

| <<Composition>> | | Comp. Ex. 9 | Comp. Ex. 10 | Ex. 10 | Ex. 11 | Ex. 12 | Ex. 13 | Ex. 14 | Ex. 15 |
|---|---|---|---|---|---|---|---|---|---|
| | NCO equivalent weight of PP | 340.0 | 380.0 | 420.0 | 460.0 | 500.0 | 540.0 | 580.0 | 620.0 |
| Prepolymer (1st component) | 2,4-TDI (parts) | 367 | 344 | 325 | 310 | 297 | 286 | 276 | 268 |
| | Hydrogenated MDI (parts) | | | | | | | | |
| | PTMG 1000 (parts) | 634 | 656 | 675 | 690 | 703 | 714 | 724 | 732 |
| | DEG (parts) | | | | | | | | |
| Chain extender (2nd component) | Liquid MOCA (parts) | 519 | 452 | 397 | 352 | 314 | 281 | 253 | 221 |
| | Solid MOCA (parts) | | | | | | | | |
| Aqueous dispersion (3rd component) | Three-functional PPG 3000 (parts) | 43 | 43 | 43 | 43 | 43 | 43 | 43 | 43 |
| | Water (parts) | 2 | 1 | 1 | 1 | 1 | 1 | 1 | 1 |
| | TOYOCAT-ET (parts) | 1 | 1 | 1 | 1 | 1 | 1 | 1 | 1 |
| | Silicone-based surfactant SH-193 (parts) | 4 | 4 | 4 | 4 | 4 | 4 | 4 | 4 |
| | Air loading rate (L/min.) | 19.1 | 19.1 | 19.1 | 19.1 | 19.1 | 19.1 | 19.1 | 19.1 |
| <<Physical properties>> | $T2_M$ (μs) | 118.0 | 145.0 | 168.0 | 189.0 | 207.0 | 232.0 | 238.0 | 252.0 |
| | $E'_{40}$ (MPa) (40° C.) | 138 | 55 | 29 | 13 | 4 | 2 | 1 | 1 |
| | Density D (g/cm$^3$) | 0.50 | 0.47 | 0.46 | 0.43 | 0.41 | 0.39 | 0.36 | 0.37 |
| | $C_M$ (% by mass) | 44.0 | 50.0 | 56.0 | 61.0 | 66.0 | 73.0 | 74.0 | 77.0 |
| | X value (=$T2_M/D$) | 236 | 309 | 365 | 440 | 505 | 595 | 661 | 681 |
| | S value | 0.72 | 0.72 | 0.72 | 0.72 | 0.72 | 0.72 | 0.72 | 0.72 |
| | Type A hardness (°) | 67 | 56 | 48 | 41 | 36 | 25 | 23 | 22 |
| | Type D hardness (°) | 45 | 35 | 28 | 20 | 16 | 11 | 8 | 6 |
| | Average cell diameter d (μm) | 132 | 142 | 145 | 156 | 161 | 168 | 170 | 168 |
| | Number of cells/mm$^2$ | 39 | 37 | 33 | 31 | 31 | 28 | 28 | 27 |
| | Thickness (mm) | 1.29 | 1.30 | 1.27 | 1.29 | 1.28 | 1.28 | 1.30 | 1.29 |
| <<Polishing test>> | Polishing rate (nm/min) | 187.5 (Poor) | 192.4 (Fair) | 194.6 (Fair) | 203.3 (Good) | 208.4 (Good) | 218.6 (Good) | 214.2 (Good) | 215.2 (Good) |
| | Polishing uniformity (CV %) | 11.8 (Poor) | 7.5 (Fair) | 6.5 (Good) | 5.7 (Good) | 4.7 (Good) | 4.2 (Good) | 5.8 (Good) | 7.5 (Fair) |
| | Presence or absence of scratches (in 5 substrates) | Present (2) (Poor) | Absent (0) (Good) | Absent (0) (Good) | Absent (0) (Good) | Absent (0) (Good) | Absent (0) (Good) | Absent (0) (Good) | Absent (0) (Good) |

TABLE 4

| <<Composition>> | | Comp. Ex. 11 | Comp. Ex. 12 | Comp. Ex. 13 |
|---|---|---|---|---|
| | NCO equivalent weight of PP | 680.0 | 720.0 | 760.0 |
| Prepolymer (1st component) | 2,4-TDI (parts) | 257 | 251 | 246 |
| | Hydrogenated MDI (parts) | | | |
| | PTMG 1000 (parts) | 743 | 749 | 754 |
| | DEG (parts) | | | |
| Chain extender (2nd component) | Liquid MOCA (parts) | 198 | 180 | 164 |
| | Solid MOCA (parts) | | | |
| Aqueous dispersion (3rd component) | Three-functional PPG 3000 (parts) | 43 | 43 | 43 |
| | Water (parts) | 1 | 1 | 1 |
| | TOYOCAT-ET (parts) | 1 | 1 | 1 |
| | Silicone-based surfactant SH-193 (parts) | 4 | 4 | 4 |
| | Air loading rate (L/min.) | 19.1 | 19.1 | 19.1 |
| <<Physical properties>> | $T2_M$ (μs) | 270.0 | 281.0 | 291.0 |
| | $E'_{40}$ (MPa) (40° C.) | 1 | 1 | 0 |
| | Density D (g/cm$^3$) | 0.31 | 0.29 | 0.26 |
| | $C_M$ (% by mass) | 82.0 | 84.0 | 87.0 |
| | X value (=$T2_M/D$) | 871 | 969 | 1119 |
| | S value | 0.72 | 0.72 | 0.72 |
| | Type A hardness (°) | 18 | 12 | 10 |
| | Type D hardness (°) | 4 | 2 | 1 |

TABLE 4-continued

| <<Composition>> | | Comp. Ex. 11 | Comp. Ex. 12 | Comp. Ex. 13 |
|---|---|---|---|---|
| | Average cell diameter d (μm) | 182 | 187 | 192 |
| | Number of cells /mm² | 24 | 23 | 23 |
| | Thickness (mm) | 1.30 | 1.28 | 1.27 |
| <<Polishing test>> | Polishing rate (nm/min) | 216.3 (Good) | 201.1 (Good) | 175.3 (Poor) |
| | Polishing uniformity (CV %) | 9.4 (Poor) | 10.3 (Poor) | 12.2 (Poor) |
| | Presence or absence of scratches (in 5 substrates) | Absent (0) (Good) | Absent (0) (Good) | Absent (0) (Good) |

<Physical Properties Evaluation>

For each of Examples and Comparative Examples described above, the $T2_M$ (μs), the $C_M$ (%), the density (g/cm³), the X value, the type A hardness (°), the type D hardness (°), the average cell diameter (μm), the number of cells per square millimeter, the storage elastic modulus $E'_{40}$ (MPa), and the thickness (mm) of the urethane sheet were calculated or measured. Tables 1 to 4 show the results.

Note that methods for measuring these items were as follows.

The pulsed NMR measurement was conducted as follows. Specifically, a glass tube having a diameter of 1 cm was filled with a sample cut into pieces of about 1 to 2 mm square to a thickness of 1 to 2 cm. Then, the relaxation behavior (free induction decay signal) of the sample was measured by using a pulsed NMR measurement apparatus (JNM-MU25 manufactured by JEOL Ltd., 25 MHz) by the solid echo method with 90° pulse of 2.0 μs, repetition time: 4 s, number of scans: 8, and temperature: 40° C. The obtained decay curve was separated by the least-squares method into an amorphous phase, an interface phase, and a crystalline phase in descending order of T2 (spin-spin relaxation time), and the $T2_M$ and the $C_M$ value were determined.

As the storage elastic modulus ($E'_{40}$ (MPa)) at 40° C., the storage elastic modulus was measured with RSA III of TA Instruments. Japan. according to JIS K 7244-4 with an initial load of 10 g, a strain range of 0.01 to 4%, and a measuring frequency of 0.2 Hz at 40° C.

The type A hardness was measured according to Japanese Industrial Standards Committee (JIS K 7311) by using a Shore A durometer. Note that the total thickness of each sample was set to at least 4.5 mm or more, by stacking four sheets of the urethane sheets (thickness: approximately 1.3 mm) described in each of Comparative Examples and Examples.

The type D hardness was measured according to JIS K 6253-1997/ISO 7619 by using a type D durometer manufactured by TECLOCK corporation. Note that the total thickness of each sample was set to at least 4.5 mm or more by stacking four sheets of the urethane sheets (thickness: approximately 1.3 mm) described in each of Comparative Examples and Examples.

The average cell diameter (μm) and the number of cells per square millimeter were determined as follows. Specifically, an area of approximately 1.3 mm square on the pad surface was observed in an enlarged manner with a microscope (VH-6300 manufactured by KEYENCE) with a magnification of 175. The obtained image was binarized with image processing software (Image Analyzer V20 LAB Ver. 1.3 manufactured by Nikon Corporation). The number of cells was counted, and the equivalent circle diameters and the average value (average cell diameter) thereof were calculated from the areas of the cells. Note that noise components were removed by setting the cutoff value (lower limit) of the cell diameters to 10 μm.

The density (g/cm³) was calculated by measuring the weight (g) of a sample cut into a piece having a predetermined size, and finding the volume (cm³) from the size.

<Polishing Test>

The polishing pad of each of Examples and Comparative Examples was polished under the following polishing conditions, and the polishing rate, the polishing uniformity, and the presence or absence of scratches were observed. As workpieces, substrates (uniformity (CV %): 13%) in which insulating films having a thickness of 1 μm were formed by CVD from tetraethoxysilane on 12-inch silicon wafers were used.

(Polishing Rate)

As the polishing rate, the amount of polishing per minute is represented by the thickness (nm). Before and after the polishing, the thicknesses of the insulating film of each substrate were measured at 17 sites, and the average value was determined from the measurement results. Note that, the thicknesses were measured with an optical film-thickness and film quality measuring apparatus (ASET-F5x manufactured by KLA-Tencor Corporation) in the DBS mode.

(Polishing Uniformity)

The polishing uniformity was determined based on the dispersion (standard deviation/average value) of the measurement results of the above-described thicknesses at the 17 sites.

(Presence or Absence of Scratches)

In the evaluation of scratches, 25 substrates were sequentially polished repeatedly three times. After the polishing, 5 substrates, namely, 21st to 25th substrates, were measured with an unpatterned wafer surface inspection system (Surfscan SP1DLS manufactured by KLA-Tencor Corporation) in the high sensitivity measurement mode. Thus, the presence or absence of scratches on the substrate surface was evaluated.

Note that the polishing conditions employed in the above-described test were as follows.

Polishing machine used: F-REX300 manufactured by EBARA CORPORATION.
Number of revolutions: 70 rpm (platen), 71 rpm (top ring).
Polishing pressure: 220 hPa.
Polishing agent: Product No: SS25 manufactured by Cabot Corporation (a mixture liquid of undiluted SS25: pure water=1:1 was used).
Polishing agent temperature: 30° C.
Amount of polishing agent discharged: 200 ml/min.
Workpiece used: a substrate in which an insulating film having a thickness of 1 μm was formed from tetraethoxysilane by CVD on a silicon wafer having a diameter of 12 inches.

Polishing time: 60 seconds/each time.

Dressing: (after a polishing cloth was attached) 10 minutes.

Tables 1 to 4 show the results of the polishing test conducted on each of Examples and Comparative Examples by using the above-described methods.

Here, since the polishing pad of the present invention needs to exhibit the effects of the polishing rate, the polishing uniformity, and the scratch reduction in a balanced manner, the results of the polishing test were evaluated as follows, in consideration of the values as a product.

A polishing rate of 200 (nm/min) or higher was evaluated as Good, a polishing rate from 190 inclusive to 200 exclusive (nm/min) was evaluated as Fair, and a polishing rate of less than 190 (nm/min) was evaluated as Poor.

A polishing uniformity of 7.0 (CV %) or less was evaluated as Good, a polishing uniformity from 7.0 exclusive to 8.0 inclusive (CV %) was evaluated as Fair, and a polishing uniformity exceeding 8.0 (CV %) was evaluated as Poor.

Regarding the presence or absence of scratches, a case where scratches were absent (0) was evaluated as Good, and a case where (one or more) scratches were present was evaluated as Poor.

Then, among the three items of the polishing rate, the polishing uniformity, and the presence or absence of scratches, polishing pads evaluated as Fair in terms of none of or one of the three items (polishing pads evaluated as Good in terms of all the three items, and polishing pads evaluated as Good in terms of two items and Fair in terms of one item) were evaluated as preferable examples (Examples), whereas samples evaluated as Fair in terms of two or more items and samples evaluated as Poor in terms of at least one item were evaluated as unfavorable examples (Comparative Examples) in the present invention.

Test Result 1

Comparative Example 1

The conventional polishing pad manufactured in Comparative Example 1 where neither air was blown nor the aqueous dispersion was used had a short $T2_M$, a high storage elastic modulus, and a high density. In addition, the polishing pad had a structure having a large number of cells per square millimeter and a small average cell diameter, i.e., a structure in which an uncountable number of very small cells were present (see the photograph on the right in FIG. 1). As a result, scratches were formed, and the obtained numeric value of the polishing uniformity was also unsatisfactory.

Test Result 2

Examples 1 to 4 and Comparative Examples 2 to 5

Here, Examples 1 to 4 and Comparative Examples 2 to 5 in which the solid MOCA was used as the chain extender are discussed. In the case where the amount of water added was large and the amount of the solid MOCA was small, the density was too low, and the results of the polishing rate and the polishing uniformity were poor (Comparative Example 2). On the other hand, in the case where the amount of water added was small and the amount of the solid MOCA was large, the density was high, and the storage elastic modulus was also high. Hence, scratches were formed, and the obtained result of the polishing uniformity was also insufficient (Comparative Examples 3 to 5).

In contrast, in the case of the polishing pads manufactured with the amounts of the solid MOCA and water being adjusted, so that the $T2_M$, the density, and the storage elastic modulus fell within the ranges of the present invention, no scratches were formed, and the obtained results of both the polishing rate and the polishing uniformity were good (Examples 1 to 4).

Test Result 3

Examples 5 to 9 and Comparative Examples 6 to 8

Examples 5 to 9 and Comparative Examples 6 to 8 in which the liquid MOCA was used as the chain extender are discussed. In the case where the amount of water added was large and the amount of the liquid MOCA was small, the density was too low, and the storage elastic modulus was also low. Hence, the obtained results were insufficient especially in terms of the polishing rate and the polishing uniformity (Comparative Example 6). On the other hand, when the amount of water added was small and the amount of the liquid MOCA was large, the density was high, and the storage elastic modulus was also high. Hence, scratches were formed, and the result of the polishing uniformity was also poor (Comparative Examples 7 to 8).

In contrast, in the case of the polishing pads manufactured with the amounts of the liquid MOCA and water added being adjusted, so that the $T2_M$, the density, and the storage elastic modulus fell within the ranges of the present invention, no scratches were formed, and the obtained results of both the polishing rate and the polishing uniformity were good (Examples 5 to 9).

Test Result 4

Examples 10 to 15 and Comparative Examples 9 to 13

Examples 10 to 15 and Comparative Examples 9 to 13 among which the content ratio of the polyisocyanate compound, the polyol compound, and the polyamine compound was varied are discussed. In the case where the amount (equivalence ratio) of the polyamine compound was too large relative to the amount of the polyol compound, the $T2_M$ was short, and the storage elastic modulus was too high, so that two or more among scratch formation, a low polishing rate, and a low polishing uniformity occurred (Comparative Examples 9 and 10).

On the other hand, in the case where the amount (equivalence ratio) of the polyamine compound was too small relative to the amount of the polyol compound, the $T2_M$ was long, and the storage elastic modulus was too low, so that the results were very poor especially in terms of the polishing rate and the polishing uniformity (Comparative Examples 11 to 13).

In contrast, in the case of the polishing pads manufactured with the equivalence ratio of the amino groups of the polyamine compound and the hydroxyl groups of the polyol compound for forming a prepolymer being adjusted, so that the $T2_M$, the density, and the storage elastic modulus fell within the ranges of the present invention, no scratches were formed, and the obtained results of both the polishing rate and the polishing uniformity were sufficiently good (Examples 10 to 15).

As is apparent from the above, in the case of the polishing pads of Examples 1 to 15, in which the $T2_M$ was 160 to 260 μs, the storage elastic modulus E' was 1 to 30 MPa, which was measured at 40° C. with an initial load of 10 g, a strain range of 0.01 to 4%, and a measuring frequency of 0.2 Hz in a tensile mode, and the density D was in a range from 0.30 to 0.60 g/cm³, no scratches were formed on the polishing surfaces of workpieces, and the obtained results of the polishing rate and the polishing uniformity were also good. Hence, it was found that, in contrast to Comparative Examples 1 to 13, the effects on all the scratch reduction, the polishing rate, and the polishing uniformity were exhibited in a balanced manner.

INDUSTRIAL APPLICABILITY

Since the polishing pad of the present invention has a $T2_M$ within a moderate range, the dressing properties are excellent. Since the opening portions are resistant to clogging because of the low density, scratches are less likely to be formed. Meanwhile, since the $T2_M$ is within the moderate range, the polishing uniformity can also be secured. In addition, also since a localized load is less likely to be applied to a workpiece because of the low storage elastic modulus and the low density, scratches can be reduced.

Moreover, the polishing pad of the present invention is softer than polishing pads having polishing layers molded by conventional dry methods, the polishing pad of the present invention is excellent also in polishing rate and polishing uniformity. Meanwhile, since the polishing pad of the present invention is dry-molded, the polishing pad has a lower wearing rate of the polishing surface than wet-molded polishing pads. Hence, the polishing pad of the present invention can retain a constant polishing state for a long period. Therefore, although dry-molded, the polishing pad of the present invention can be advantageously used for both primary processing and finish processing. Therefore, the polishing pad of the present invention and the manufacturing method therefor have industrial applicability.

The invention claimed is:

1. A polishing pad for polishing a semiconductor device, comprising a polishing layer having a polishing surface and comprising a polyurethane-polyurea resin foam containing substantially spherical cells, wherein
when a free induction decay signal (FID) of the polyurethane-polyurea resin foam obtained by pulsed NMR is subjected to waveform separation by sequentially subtracting components in descending order of spin-spin relaxation time T2 based on a least-squares method, and thus divided into three components of L (amorphous phase), M (interface phase), and S (crystalline phase) in descending order of spin-spin relaxation time T2, the M-component has a spin-spin relaxation time $T2_M$ of 180 to 240 µs,
the polyurethane-polyurea resin foam has a storage elastic modulus E' of 1 to 20 MPa, the storage elastic modulus E' being measured at 40° C. with an initial load of 10 g, a strain range of 0.01 to 4%, and a measuring frequency of 0.2 Hz in a tensile mode,
the polyurethane-polyurea resin foam has a density D in a range from 0.30 to 0.60 g/cm³, and
the polyurethane-polyurea resin foam has a type A hardness of 20 to 55 degrees, and
the polyurethane-polyurea resin foam has an average cell diameter of 140 to 170 µm.

2. The polishing pad according to claim 1, wherein
the ratio ($C_M$) of the M component present in the resin foam is in a range from 55 to 80% by mass, and
an X value determined by $X=T2_M/D$ is in a range from 350 to 800.

3. The polishing pad according to claim 1, wherein
a layer harder than the polishing layer is laminated on a surface of the polishing layer, the surface being opposite from said polishing surface of the polishing layer.

4. A method for manufacturing the polishing pad according to claim 1, the method comprising:
a preparation step of preparing an isocyanate group-containing compound (A), a polyisocyanate compound (B), a polyamine compound (D), a mixture liquid (E) comprising water, a foam stabilizer, and a reaction catalyst, and a gas non-reactive with all the components;
a mixing step of mixing at least the isocyanate group-containing compound (A), the polyisocyanate compound (B), the polyamine compound (D), the mixture liquid (E) comprising the water, the foam stabilizer, and the reaction catalyst, and the gas non-reactive with all the components with each other to obtain a mixture liquid for molding a foam;
a foam-molding step of molding a polyurethane-polyurea resin foam from the mixture liquid for molding a foam; and
a polishing layer formation step of forming a polishing layer having a polishing surface for polishing a workpiece from the polyurethane-polyurea resin foam.

5. The method for manufacturing the polishing pad according to claim 4, wherein
in the preparation step, a polyol compound (C-2) is further prepared, and
in the mixing step, the polyol compound (C-2) is mixed.

6. The method for manufacturing the polishing pad according to claim 5, wherein
in the preparation step, the polyamine compound (D) and the polyol compound (C-2) are prepared, with the equivalence ratio of amino groups of the polyamine compound (D) to the sum of the chemical equivalents of the amino groups of the polyamine compound (D) and hydroxyl groups of the polyol compound (C-2) (the chemical equivalent of active hydrogen groups) being 0.70 to 0.97 (the amino groups/(the amino groups+the hydroxyl groups)).

7. The method for manufacturing the polishing pad according to claim 4, wherein
the polyamine compound (D) is a crude methylenebis(o-chloroaniline) (MOCA) which is a mixture of monomer and multimers of MOCA and which contains the multimers in an amount of 15% by mass or more.

8. The method for manufacturing the polishing pad according to claim 5, wherein
the polyol compound (C-2) is poly(tetramethylene glycol) or poly(propylene glycol) having a number average molecular weight of 500 to 5000, or a mixture thereof.

9. The polishing pad according to claim 1, wherein the polishing layer consists of the polyurethane-polyurea resin foam.

* * * * *